United States Patent
Starr et al.

(10) Patent No.: US 6,891,401 B2
(45) Date of Patent: May 10, 2005

(54) CLOCK LOSS DETECTION AND SWITCHOVER CIRCUIT

(75) Inventors: Greg Starr, San Jose, CA (US); Edward Aung, San Leandro, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/213,115

(22) Filed: Aug. 5, 2002

(65) Prior Publication Data

US 2003/0034820 A1 Feb. 20, 2003

Related U.S. Application Data

(60) Provisional application No. 60/310,136, filed on Aug. 3, 2001.

(51) Int. Cl.[7] ............................. G01R 19/00; H03K 5/19
(52) U.S. Cl. ............................. 327/18; 327/20; 327/298
(58) Field of Search .................... 327/20, 18, 99, 327/292, 298; 326/93, 95, 98; 331/1 A, 17, 25

(56) References Cited

U.S. PATENT DOCUMENTS

| | | | | |
|---|---|---|---|---|
| 3,708,686 A | * | 1/1973 | Butler et al. ............... | 307/149 |
| 4,156,200 A | | 5/1979 | Gomez ....................... | 327/292 |
| 5,065,042 A | * | 11/1991 | Thomsen et al. ............ | 327/160 |
| 5,416,443 A | | 5/1995 | Granford, Jr. et al. ......... | 331/2 |
| 5,604,452 A | * | 2/1997 | Huang ........................ | 327/99 |
| 5,642,069 A | | 6/1997 | Waite ......................... | 327/292 |
| 5,886,557 A | | 3/1999 | Wilcox ....................... | 327/292 |
| 5,969,558 A | * | 10/1999 | Abe ........................... | 327/292 |
| 6,163,172 A | | 12/2000 | Bazuin et al. ............... | 326/93 |
| 6,239,626 B1 | * | 5/2001 | Chesavage .................. | 327/99 |

FOREIGN PATENT DOCUMENTS

EP         0 992 911         4/2000

OTHER PUBLICATIONS

XILINX, "Virtex–II 1.5V Field–Programmable Gate Arrays", Advance Product Specification, Apr. 2, 2001, 36 pgs., see pp. 25–29.
International Search Report mailed on Mar. 9, 2004, for PCT patent application No. PCT/US02/24893 filed on Aug. 5, 2002, 6 pages.

* cited by examiner

Primary Examiner—Tuan T. Lam
(74) Attorney, Agent, or Firm—Morrison & Foerster LLP

(57) ABSTRACT

In one aspect, an embodiment provides a clock loss sense and switchover circuit and method in which clock switchover is responsive to loss of a primary signal and to additional switch command signaling. In another aspect, an embodiment provides a clock loss sense circuit and method that utilizes counters and reset signals to compare a primary clock and secondary clock signal.

31 Claims, 5 Drawing Sheets

SAME FREQUENCY

DIFFERENT FREQUENCY

CLOCK LOSS DETECTION AND SWITCHOVER CIRCUIT

CROSS-REFERENCE TO RELATED APPLICATIONS

The present application claims the benefit if U.S. Provisional Application No. 60/310,136, entitled Clock Loss Detection Circuit For Switchover Capability filed Aug. 3, 2001, which is incorporated herein by reference.

BACKGROUND OF THE INVENTION

1. Field of the Invention

This invention relates generally to the electronic arts and more particularly to circuits for detecting clock loss and effecting switchover of clock signals.

2. Description of Related Art

Many electronic devices, including programmable logic devices, utilize clock signals. Programmable logic devices ("PLDs") (also sometimes referred to as PALs, PLAs, FPLAs, EPLDs, EEPLDs, LCAs, or FPGAs), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits; however, it is possible to provide an ASIC that has a portion or portions that are programmable; thus, it is possible for an integrated circuit device to have qualities of both an ASIC and a PLD. The term PLD as used herein will be considered broad enough to include such devices.

Clock signals may be generated internally or externally to the electronic device. In some instances, it may be desirable to provide two or more clock signals that may be used alternatively. One reason for providing two or more alternate clock signals may be to accomplish redundancy that allows operation to be maintained even if the primary clock signal utilized by the device is lost or otherwise not functioning properly. Another reason for providing two or more alternate clock signals may be to select between different frequencies for operating the device or a portion of the device. While it is known to provide for switchover on loss of a clock signal, there is also a need to provide flexibility in the same device to switch between clock signals for clock loss reasons on the one hand and user-determined reasons on the other. Furthermore, there is also a need for a simple digital clock loss detection circuit.

SUMMARY OF THE INVENTION

An embodiment of the present invention provides in one aspect a clock loss sense circuit that utilizes counters and edge sensors to quickly and simply determine loss of a primary clock signal. In another aspect, an embodiment of the present invention provides a clock switchover circuit responsive both to clock loss signals and to additional switch command signals. In a further aspect, the clock switchover circuit is also responsive to a signal indicating whether or not lock has been achieved in a phase-locked loop (PLL) circuit to which a primary clock signal is provided as a reference clock signal. In another aspect, switchover synchronization may occur automatically with reference to the secondary (switched to) clock or may be selected to occur with reference to both the primary (switched from) clock and the secondary switched to clock.

BRIEF DESCRIPTION OF THE DRAWINGS

The novel features of the invention are set forth in the appended claims. However, for purposes of explanation, a particular embodiment of several aspects of the invention is described by reference to the following figures.

DETAILED DESCRIPTION OF THE PREFERRED EMBODIMENTS

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Although particular embodiments have been described in detail, various modifications to the embodiments described herein may be made without departing from the spirit and scope of the present invention, thus, the invention is limited only by the appended claims.

Figure 1:
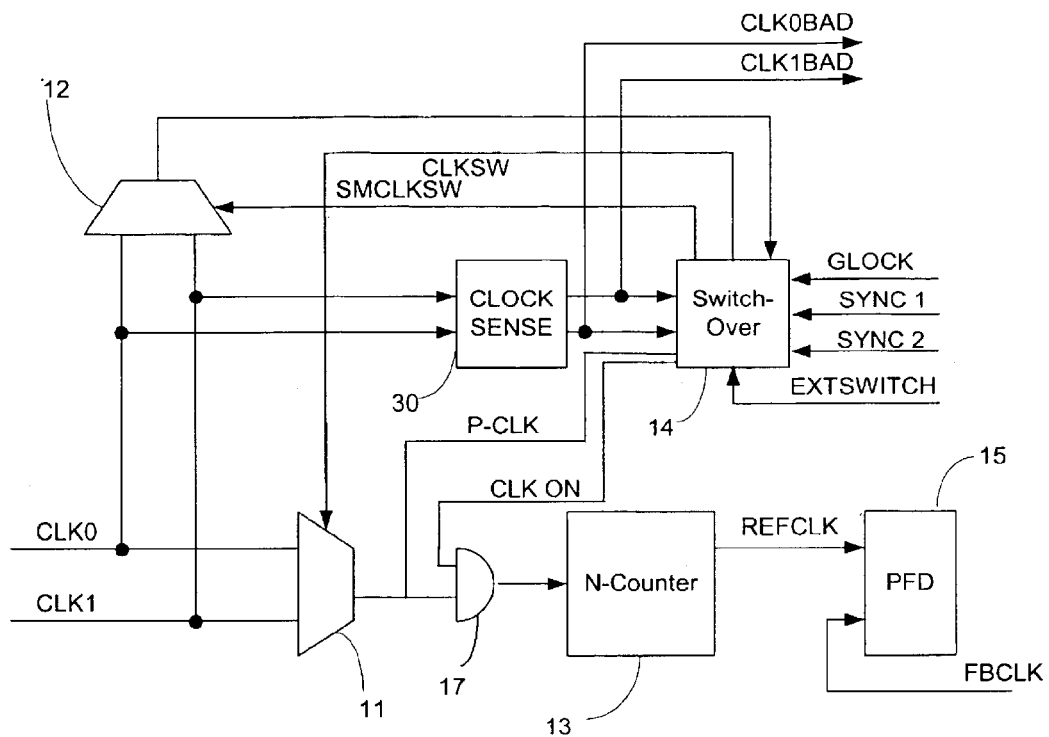
FIG. 1 is a diagram showing a clock loss sense and switching circuit in accordance with principles of an aspect the present invention.

FIG. 1 is a diagram of a clock loss sense and switchover circuit 10 in accordance with principles of an aspect of the present invention. Circuit 10 receives two clock signals, CLK0 and CLK1, which are routed to be received by multipiexor ("mux") 11, mux 12, and by clock sense circuit 30 as shown. Based on a control signal CLKSW received from switchover circuit 14, mux 11 selects one of the two clock signals to provide through N-counter 13 for providing signal REFCLK as input to phase-frequency detector (PFD) 15 of the PLL circuitry of an electronic device in which circuit 10 is implemented. PLLs are typically used as part of clock circuitry for generating clock signals for driving a device. Based on a control signal SMCLKSW received from switchover circuit 14, mux 12 selects one of the two clock signals to provide for running switchover circuit 14 as shown.

Clock sense circuit 30' generates signals CLK0BAD and CLK1BAD which indicate whether or not, respectively, the CLK0 and CLK1 signals are functioning properly. Clock switchover circuit 14 controls muxes 11 and 12 to select clock signals based upon the input signals received from clock sense circuit 20, the input signal EXTSWITCH received from the device (either based on user input or other pre-defined conditions not related to the loss of either CLK0 or CLK1), and based upon the GLOCK signal received from the device's PLL circuitry. The GLOCK signal indicates whether or not lock has been achieved with the signal REFCLK.

As an initial condition, the CLKSW control signal is such that mux 11 selects either CLK0 or CLK1 as the primary clock signal, i.e., the clock signal to be presently provided to the clock circuitry (in this case PLL circuitry) of the electronic device. The other signal is the secondary clock signal. The signal SMCLKSW control signal is such that mux 12 selects the secondary clock signal to run switchover circuit 14. This provides a straightforward method of ensuring that circuit 10 will not trigger a switch to a clock signal that is not running because if the secondary clock is lost, switchover circuit 14 is inactive and does not trigger a switchover.

Switchover circuit 14 can initiate a switch from a primary to a secondary clock signal either in response to a signal from clock sense circuit 30 indicating that the primary clock (CLK0 or CLK1) is bad, or in response to the EXTSWITCH signal indicating a switch. EXTSWITCH might be used to allow a user to trigger a switch between clocks of different frequencies, or might be used to trigger a response based on some other set of criteria. Furthermore, the GLOCK signal indicates whether or not the PLL circuit of the electronic device has achieved lock with the primary clock signal. If the GLOCK signal indicates that lock has been lost, switchover circuit 14 also can initiate a switch from the primary to a secondary clock.

When switchover circuit 14 receives a signal indicating a switch (which may be indicated in response to the CLK0BAD, CLK1BAD, EXTSWITCH, or GLOCK signals) it toggles the CLCKSW signal sent to mux 11 and the SMCLK signal sent to mux 12 so that the clock signal selected by each mux switches. However, when switching, a synchronization sequence is implemented to ensure proper transition between signals. Switchover circuit 14 implements a synchronization process based on control signals SYNC1 and SYNC2, and based on whether the primary clock at the time switchover is initiated is good or bad. AND gate 17 is used to gate off the clock signal from the PLL clock circuit during synchronization as will now be explained with reference to the state diagram of FIG. 2.

Figure 2:
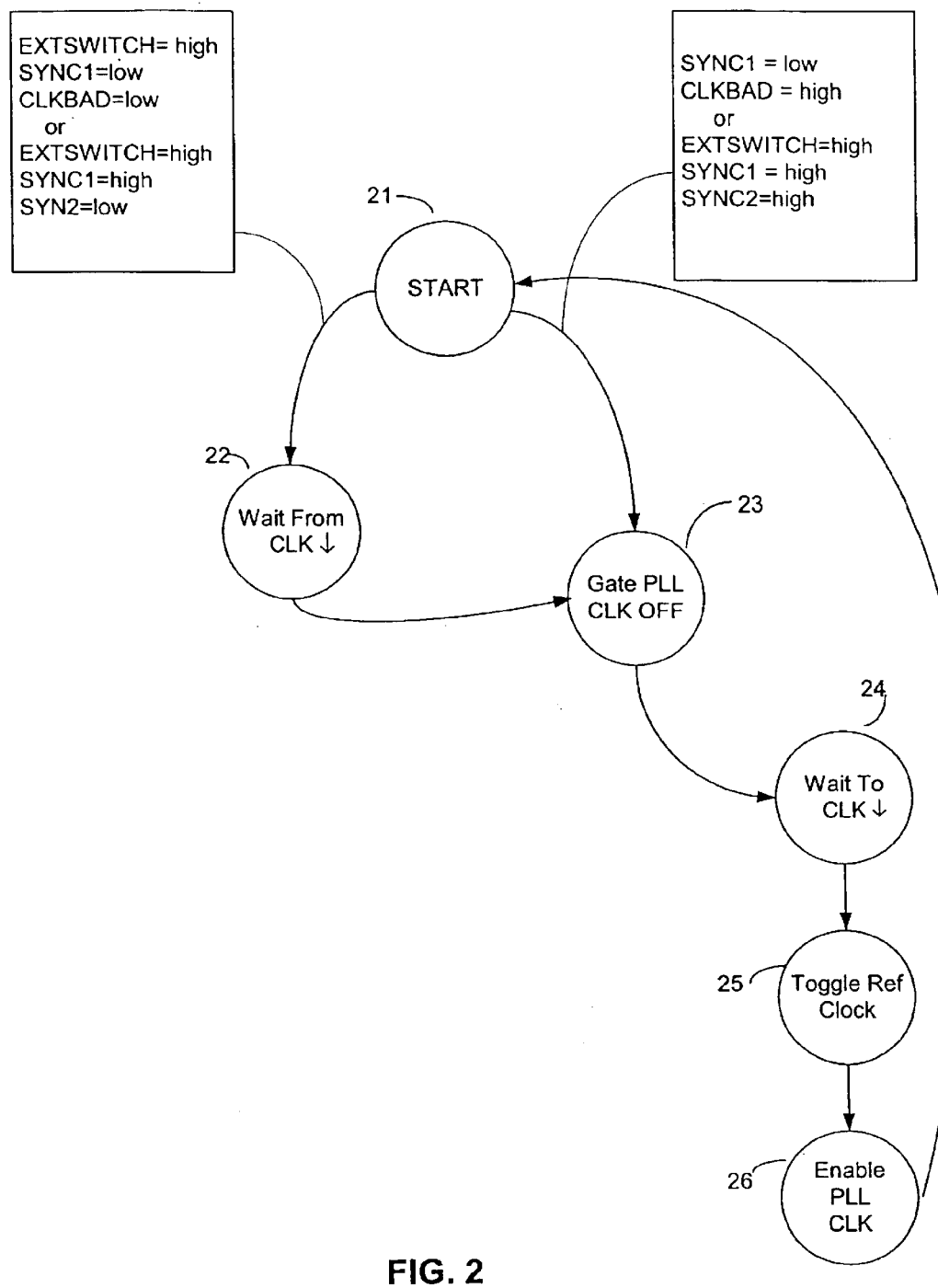
FIG. 2 is a state diagram showing states implemented by the switchover circuit portion of the circuit of FIG. 1 in order to implement synchronization on clock switchover.

FIG. 2 shows the states implemented by switchover circuit 14 to synchronize on switchover. This process helps ensure that the first high signal pulse provided in the signal sent from mux 11 to N-Counter 13 after switchover is not excessively narrow. START state 21 defines the system when a given clock signal (CLK0 or CLK1) is being provided to N-Counter 13 through mux 11. In START state 21, switchover circuit 14 provides a high CLKON signal to AND gate 17 so that the primary clock signal is provided to N-COUNTER 17 for providing signal REFCLK to PFD 15. Switchover may be implemented either because the primary clock signal is lost (as indicated by the relevant signal CLK0BAD or CLK1BAD), or because a signal switch is initiated for other reasons based on signal EXTSWITCH.

Control signals SYNC1 and SYNC2 are used to determine whether or not synchronization will be based on just the "to" clock signal, i.e. the clock signal of the secondary clock, or whether it will be based on both the "to" clock signal and the "from" clock signal, i.e. the signal of the primary clock. If SYNC1 is set low, then the system will be in what might be called an "auto-synchronize" mode which only switches clocks if the primary clock signal goes bad. If the primary clock is bad, then the system bypasses Wait From CLK state 22 and transitions directly to Gate PLL CLK OFF state 23. In this state, clock switchover circuit 14 provides a low CLKON signal to AND gate 17, thereby gating off the primary clock signal from the electronic device's PLL circuit. In Wait To CLK state 24, the system waits for the secondary clock signal to fall to a low level. Then, in Toggle Ref CLK state 25, switchover circuit 14 changes the CLKSW signal sent to mux 11 so that the secondary rather than the primary clock signal (CLK0 or CLK1) is selected. Finally, once the secondary clock signal is selected, switchover circuit 14 changes the CLKON signal sent to AND gate 17 from low to high so that the new clock signal (i.e. the secondary or "to" clock signal) can now be provided to N-Counter 13 to provide the REFCLK signal to PFD 15 of the PLL of the electronic device. The system then transitions back to START state 21.

If SYNC1 is high, then the system is in what might be termed a "manual" synchronize mode. In such a mode, whether or not the "from" clock is used in the synchronization process (i.e., whether or not the system will transition from START state 21 to Wait From CLK state 22 rather than transition directly to Wait To CLK state 23 as described above) will depend upon whether or not SYNC2 is high. If SYNC2 is low and SYNC1 is high, then the system will transition from START state 21 to Wait From CLK state 22 when EXTSWITCH is high. In state 22, the system waits for the primary clock to be low before transitioning to Gate PLL CLK OFF state 23. Switchover circuit 14 monitors the output of mux 11 (signal P-CLK) as shown and thus is able to determine when the primary clock is low. Once the system is at state 22, then state transitions proceed as already described above. Note that if SYNC1 is set high, SYNC2 should only be set low if both clocks are expected to always be present. If SYNC1 is high and SYNC2 is high, then the system will always synchronize only to the "to" clock, and transitions proceed as previously described, directly from state 21 to state 23 rather than also using state 22. In such a mode (SYNC1 high and SYNC2 high), a transition might be initiated either by the primary clock bad signal being high, or the EXTSWITCH signal being high.

Those skilled in the art will recognize that the above relationship between synchronization signals are only examples and other variations are possible without departing from the spirit and scope of this aspect of the invention. To cite but one alternative, a "manual" mode might be implemented that is automatically over-ridden whenever the primary clock goes bad. In other words, one might vary the above example and implement logic such that even if SYNC1 is high and SYNC2 is low, the system will not try to transition to state 22 if the from clock is bad.

Figure 3:
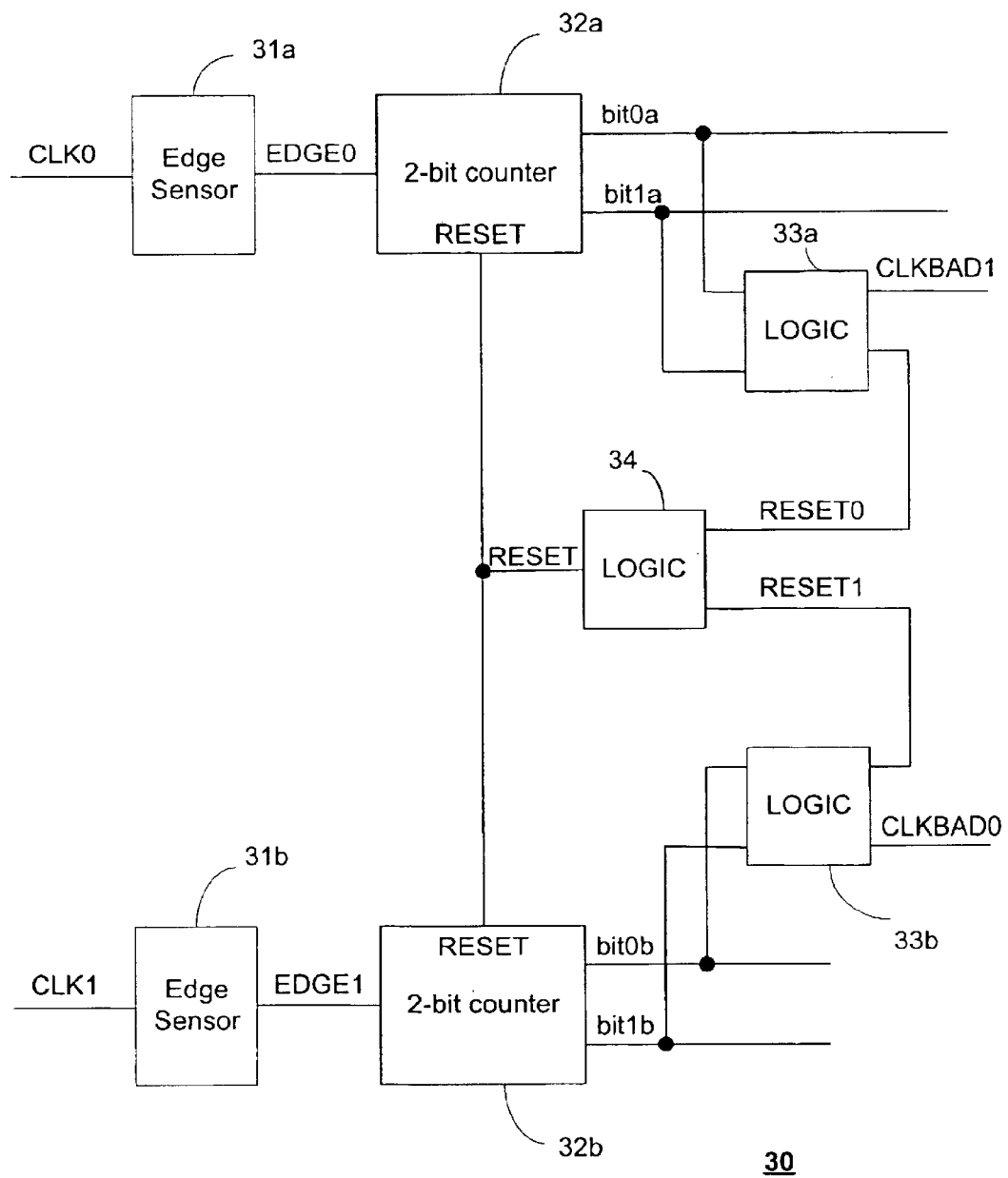
FIG. 3 is a diagram showing in greater detail the clock loss sense portion of the circuit of FIG. 1, the clock loss sense portion being in accordance with principles of an aspect of the present invention.

FIG. 3 is a diagram of the clock loss sense circuit 30 of circuit 10 in FIG. 1. Signals CLK0 and CLK1 are received at, respectively, edge sensor circuits 31a and 31b. Edge sensor circuits 31a and 31b produce, respectively, signals EDGE0 and EDGE1 indicative of the edges of, respectively, clock signals CLK0 and CLK1. Signals EDGE0 and EDGE 1 have pulses for both the rising and falling edges of the respective clock signals CLK0 and CLK1. In an alternative embodiment, clock signals might be provided directly to respective counters for counting each clock pulse rather than each clock signal transition. However, use of edge sense circuits as shown in the illustrated embodiment allows for more rapid detection of a lost clock signal. Signals EDGE0 and EDGE1 are provided to, respectively, 2-bit counters 32a and 32b. Counters 32a and 32b produce incremented counts for each pulse of the respective edge signals and the counts are output as signals bit0*a* and bit 1*a* (for counter 32*a*) and bit0*b* and bit1*b* (for counter 32*b*).

Signals bit0*a* and bit1*a* are provided to first stage logic circuit 33*a* and signals bit0*b* and bit1*b* are provided to first stage logic circuit 33*b*. First stage logic circuit 33*a* outputs two signals, CLKBAD1 and RESET0. First stage logic circuit, 33*b* also outputs two signals, CLKBAD0 and RESET1. Logic circuit 33*a* implements an AND function making CLKBAD1 an AND function of the input signals bit0*a* and bit1*a*. Similarly, logic circuit 33*b* implements an AND function making CLKBAD0 an AND function of the input signals bit 0*b* and bit 1*b*. Thus, if counter 32*a* ever reaches a count of "3", i.e., "11" in binary form, without being reset, CLKBAD1 becomes high indicating that signal CLK1 is bad. Similarly, if counter 32*b* ever reaches a count of "3", i.e., "11"in binary form, without being reset, CLKBAD0 becomes high indicating that signal CLK0 is bad. The reason for such a relationship between the counter values and the clock loss signaling will now be explained with reference to the additional logic functions implemented by circuits 33*a*, 33*b*, and 34.

First stage logic circuit 33*a* also implements a XOR function such that the output signal RESET0 is a XOR function of the input bits bit0*a* and bit1*a*. Thus, RESET0 is high if the count of counter 32*a* is 1 ("01" in binary form), or 2 ("10" in binary form) but otherwise is low. Similarly, first stage logic circuit 33*b* implements a XOR function such that the output signal RESET1 is a XOR function of the input bits bit0*b* and bit1*b*.

Second stage logic circuit 34 implements an AND function such that its output signal RESET is an AND function of its input signals RESET0 and RESET1. When RESET is high, both counters are reset to 0 ("00" in binary form). The effect of the combined implementation of counters 32*a* and 32*b*, first stage logic circuits 33*a* and 33*b*, and second stage logic circuit 34, all connected as shown, is that if the counter receiving the signal indicative of clock signal CLK0 (i.e. counter 32*a*) reaches a count of 3 without being reset, this indicates that clock signal CLK1 is bad. Similarly, if the counter receiving the signal indicative of clock signal CLK1 (i.e. counter 32*b*) reaches a count of 3 without being reset, this indicates that clock signal CLK0 is bad.

The logic functions implemented may be summarized by the following truth tables:

| bit0a | bit1a | RESET0 | CLKBAD1 |
| --- | --- | --- | --- |
| 0 | 0 | 0 | 0 |
| 0 | 1 | 1 | 0 |
| 1 | 0 | 1 | 0 |
| 1 | 1 | 0 | 1 |

| bit0b | bit1b | RESET1 | CLKBAD0 |
| --- | --- | --- | --- |
| 0 | 0 | 0 | 0 |
| 0 | 1 | 1 | 0 |
| 1 | 0 | 1 | 0 |
| 1 | 1 | 0 | 1 |

| RESET0 | RESET1 | RESET |
| --- | --- | --- |
| 0 | 0 | 0 |
| 0 | 1 | 0 |
| 1 | 0 | 0 |
| 1 | 1 | 1 |

It will appreciated by those skilled in the art that for purposes of the principles illustrated by the exemplary circuit 30, complementary functions may be used in other contexts to achieve identical results. Thus, for purposes herein, the terms AND and XOR will be considered to also include their complementary functions NAND and XNOR or other sets of logic gates that, when implemented, achieve the same results as indicated herein. Moreover, logic functions other than AND and XOR may be used without necessarily departing from the spirit and scope of broader aspects of the present invention.

Figure 4A:
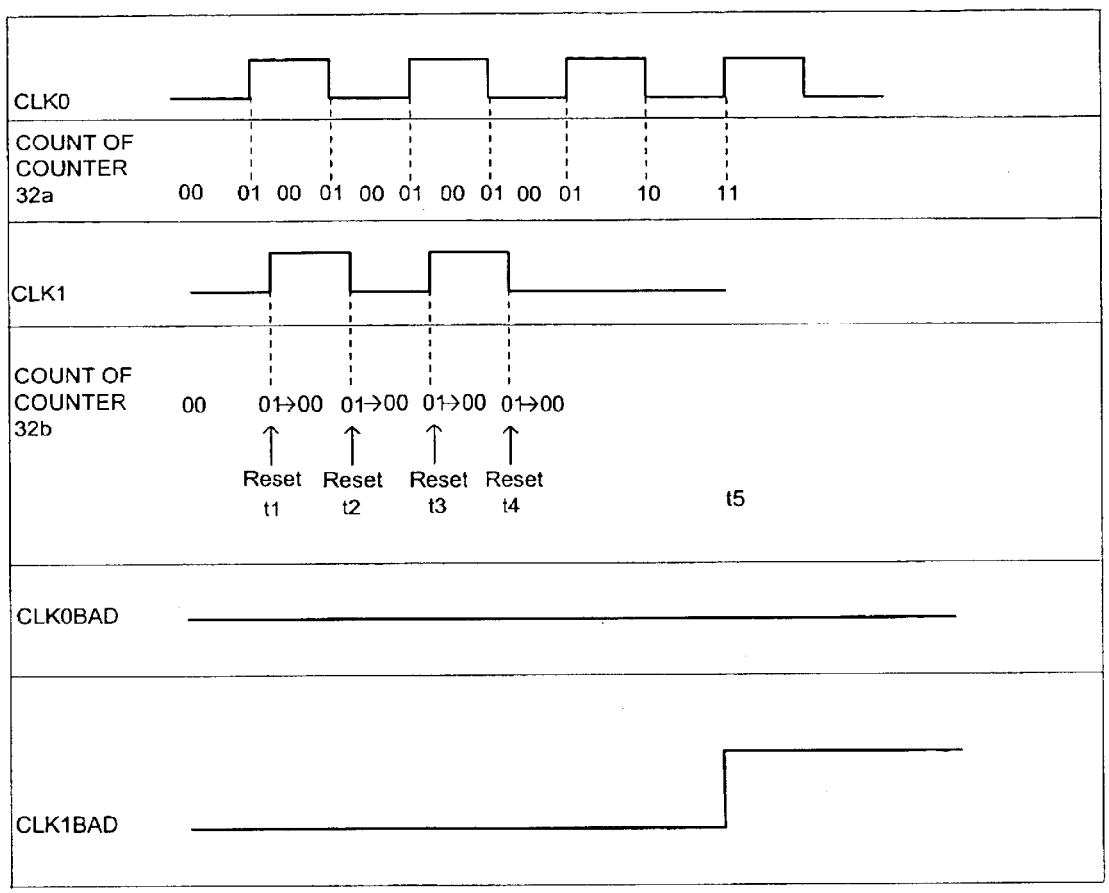
FIG. 4a is a timing diagram illustrating count values, count reset, and "clock bad" signaling for two exemplary clock signals provided to the clock loss sense circuit of FIG. 3, the two clock signals having substantially the same frequency.

FIG. 4*a* illustrates count values, reset, and clock loss signaling for two exemplary clock signals of substantially the same frequency provided to the clock loss sense circuit of FIG. 3. Assuming both counters start at 00 at the left side of the diagram, and viewing the diagram from left to right, a transition first occurs for signal CLK0, which in turn increments the count of counter 32*a* to 01 (i.e. "1 " expressed in binary form). The next transition occurs for signal CLK1, which in turn increments the count of counter 32*b* to 01. Based on the above referenced truth tables, the condition of both counters having a value of 01 will trigger a reset. Thus, a reset occurs at time t1 and both count values are reset to 00. This pattern repeats as illustrated with resets occurring again at times t2, t3, and t4. However, after t4, clock signal CLK1 stops pulsing. Thus, after t4, the count of counter 32*a* continues to increment while the count of counter 32*b* remains at 00. As long as one of the counts remains at 00, based on the above referenced truth tables, no RESET signal occurs, and thus the count of counter 32*a* increments through the following values: 01, 10 (binary "2"), and 11 (binary "3"). Once the count reaches 11, based on the above referenced truth tables, signal CLK1BAD will go high at t5, indicating that the signal CLK1 is bad.

Figure 4B:
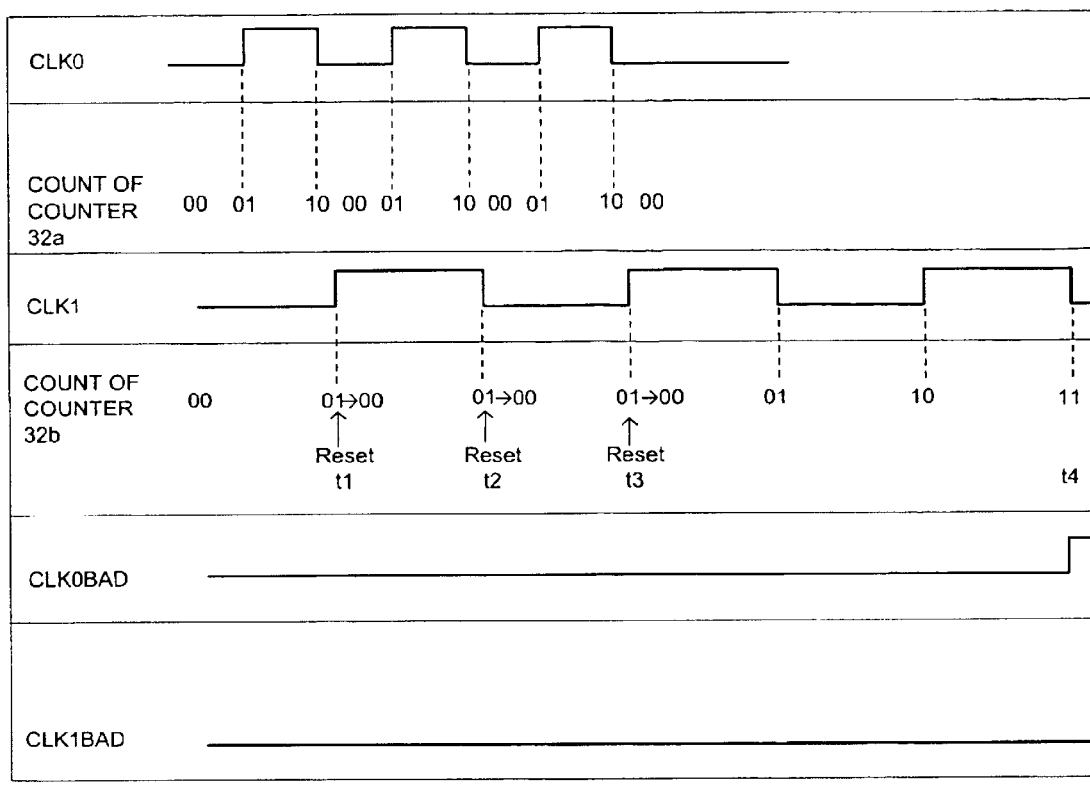
FIG. 4b is a timing diagram illustrating count values, count reset, and "clock bad" signaling for two exemplary clock signals provided to the clock loss sense circuit of FIG. 3, the two clock signals having different frequencies.

FIG. 4*b* illustrates count values, reset, and clock loss signaling for two exemplary clock signals of substantially different frequencies provided to the clock loss sense circuit of FIG. 3. Assuming both counters start at 00 at the left side of the diagram, and viewing the diagram from left to right, a transition first occurs for signal CLK0, which in turn increments the count of counter 32*a* to 01. The next transition that occurs is also for signal CLK0, which in turn increments the count of counter 32*a* to 10 (binary "2"). The next transition that occurs is for signal CLK1, which in turn increments the count of counter 32*b* to 01. Based on the above referenced truth tables, the condition of both counters having a value of either 01 or 10 will trigger a reset signal RESET. Thus, a reset occurs at time t1 and both count values are reset to 00. This pattern repeats as illustrated with resets occurring again at times t2 and t3. However, after t3, clock signal CLK0 stops pulsing. Thus, after t3, the count of counter 32*b* continues to increment while the count of counter 32*a* remains at 00. As long as one of the counts remains at 00, based on the above referenced truth tables, no RESET signal occurs, and thus the count of counter 32*b* increments through the following values: 01, 10 ("2"), and 11 ("3"). Once the count of counter 32*b* reaches 11, based on the above referenced truth tables, signal CLK0BAD will go high at time t4, indicating that the signal CLK1 is bad.

The disclosed clock loss sense circuit illustrates the principle that reset of the counters (e.g., in the disclosed example, the signal RESET being high) is responsive to a count of the first counter in combination with a count of the second counter, i.e., the reset of the counters is a logical function of the first count and second count.

It will be appreciated by those skilled in the art that, as illustrated in FIG. 4*b*, the disclosed example of a clock loss detection circuit is tolerant of a certain frequency difference between the clock signals. In other words, the two clock signals may be functioning properly at different frequencies without necessarily triggering a clock loss signal indicating a "bad" signal. However, at frequency differences greater than a certain threshold, the disclosed exemplary clock loss circuit will indicate that one clock signal is "bad" relative to the other. The magnitude of that frequency difference will depend on particular design choices made including, for example, the size of the counters used and the logic circuits implemented. However, it may also be desirable to modify the disclosed embodiment or alternative embodiments of the invention to provide a system wherein clock loss signaling may be selectively disabled or selectively ignored so that, for example, a clock switchover circuit does not trigger a switchover based on a clock loss signal. Such a modification would allow the use of clock signals having a frequency difference above a threshold tolerated by a particular clock loss sense circuit embodiment.

Other modifications could provide alternative embodiments in which arbitrarily large frequency differences are permitted and, for example, a clock loss circuit is configured to detect whether the frequency of one signal has varied too much relative to the frequency of another signal. In such an alternative, for example, detection and reset circuitry could provide a clock bad signal responsive to a ratio of a first count of a first counter and a second count of a second counter. To the extent that the ration of two counter values is reflective of the frequency ratio of two clock signals, a counter ratio reaching a certain upper or lower limit would indicate that the frequency of one clock signal has changed relative to the other beyond a prescribed upper or lower limit. In such alternatives, one of two clock signals might be designated as "golden", or the standard signal whose frequency is used to determine whether the frequency of the other is "bad." Such an alternative would likely use a counter large than 2-bits, so as to make possible a wider range of counter ratios.

In general, it will be understood by those skilled in the art that many other variations on the disclosed embodiments are possible without departing from the spirit and scope of various aspects of the invention. To cite but one example, larger counters (e.g. 3-bit) may be used in alternative embodiments of the clock loss sense circuit illustrated herein. Such larger counters would, of course, affect the delay in detecting loss of a clock signal which may be desirable, for example, in applications where there is a desire to detect changes in frequency difference between two reference clocks and make such changes a condition for switching. Thus the embodiments discussed are only examples. The underlying principles illustrated are not limited by the particular examples shown. The present invention is limited only by the appended claims.

We claim:

1. A clock loss sense circuit comprising:
   a first counter coupled to receive a first signal indicative of a first clock signal and coupled to provide a first count responsive to the first signal;
   a second counter coupled to receive a second signal indicative of a second clock signal and coupled to provide a second count responsive to the second signal; and
   a reset circuit coupled to provide a reset signal to the first and second counters responsive to the first count and combination with the second count; and
   a detection circuit coupled to determine when the first count or the second count reaches a prescribed value.

2. The clock loss sense circuit of claim 1 wherein the detection circuit provides a first output responsive to the first counter reaching the prescribed value and provides a second output responsive to the second counter reading the prescribed value.

3. The clock loss sense circuit of claim 2 wherein the first output indicates that the second clock signal is bad when the first counter reaches the prescribed value.

4. The clock loss sense circuit of claim 2 wherein the second output indicates that the first clock signal is bad when the second counter reaches the prescribed value.

5. The clock loss sense circuit of claim 1 wherein the prescribed value is three.

6. The clock loss sense circuit of claim 1 wherein first signal is the first clock signal and the second signal is the second clock signal.

7. The clock loss sense circuit of claim 1 further comprising:
   a first edge sense circuit coupled to receive the first clock signal and to provide the first signal to the first counter, the first signal being indicative of, and triggering counts for, each transition of the clock signal; and
   a second edge sense circuit coupled to receive the second clock signal and to provide the second signal to the second counter, the second signal being indicative of, and triggering counts for, each transition of the clock signal.

8. The clock loss sense circuit of claim 1 wherein the first and second counters are 2-bit counters.

9. The clock loss sense circuit of claim 1 wherein:
   the react circuit and the detection circuit together comprise two first stage logic circuits and one second stage logic circuit;
   a first of the first stage logic circuits is coupled to receive the count of the first counter and to provide, based on the count of the first counter, a first output bit to the second stage logic circuit;
   a second of the first stage logic circuits is coupled to receive the count of the second counter and to provide, based on the count of the second counter, a first output bit to the second stage logic circuit; and
   the second stage logic circuit is coupled to provide the reset signal based upon the first output bits of the first and second of the first stage logic circuits.

10. The clock loss sense circuit of claim 9 wherein:
    the first and second counters include two-bit counters;
    the first and second counts are each provided as two counting bits; and
    the first output bits of the first and second of the first stage logic circuits represents at least XOR functions of the counting bits of the first and second counters and the reset signal represents at least an AND function of the first output bits of the first and second of the first stage logic circuits.

11. The clock loss sense circuit of claim 9 wherein:
    the first and second counts are each provided as counting bits; and
    the first and second of the first stage logic circuits are also coupled to provide second output bits, a second output bit of the first of the first stage logic circuits representing at least an AND function of the counting bits provided by the first counter and being indicative of whether the second clock signal is bad and a second output bit of the second of the first stage logic circuits representing at least an AND function of the counting bits provided by the second counter and being indicative of whether the first clock signal is bad.

12. A programmable logic device comprising the clock loss sense circuit of claim 1.

13. A programmable logic device comprising the clock loss sense circuit of claim 2.

14. A programmable logic device comprising the clock loss sense circuit of claim 3.

15. A programmable logic device comprising the clock loss sense circuit of claim 4.

16. A programmable logic device comprising the clock loss sense circuit of claim 5.

17. A programmable logic device comprising the clock loss sense circuit of claim 6.

18. A programmable logic device comprising the clock loss sense circuit of claim 7.

19. A programmable logic device comprising the clock loss sense circuit of claim 8.

20. A programmable logic device comprising the clock loss sense circuit of claim 9.

21. A programmable logic device comprising the clock loss sense circuit of claim 10.

22. A programmable logic device comprising the clock loss sense circuit of claim 11.

23. A method of determining loss of a primary clock signal, the primary clock signal being one of a first and second clock signals, the method comprising:

providing the first clock signal to a first counter;

providing the second clock signal to a second counter;

providing react signals to the first and second counters conditioned upon both counters continuing to increment; and identifying the first clock signal or the second clock signal as bad if when respectively, the second counter or the first counter reaches a prescribed count without being reset.

24. The method of claim 23 wherein the first and second clock signals are provided to the first and second counters through edge sense circuits such that the respective first and second counters are incremented for each rising and falling edge of the respective first and second clock signals.

25. The method of claim 23 wherein the first and second counters include two-bit counters and the prescribed count is three.

26. A clock loss sense circuit comprising:

a first counter coupled to receive a first signal indicative of a first clock signal and coupled to provide a first count responsive to the second signal;

a second counter coupled to receive a second signal indicative of a second clock signal and coupled to provide a second count responsive to the second signal; and a reset circuit coupled to provide a reset signal to the first and second counters responsive to the first count in combination with the second count; and a detection circuit coupled to determine when a ratio of the count and the second count crosses a prescribed value.

27. The clock loss sense circuit of claim 26 wherein:

the prescribed value is a first prescribed value and the detection circuit determines when the ratio exceeds the first prescribed value; and the detection circuit is also coupled to determine when the ratio falls below a second prescribed value.

28. The clock loss sense circuit of claim 26 wherein the detection circuit provides an output responsive to the ratio crossing the prescribed value.

29. The clock loss sense circuit of claim 27 wherein the detection circuit provides an output responsive to the ratio either exceeding the first prescribed value or falling below the second prescribed value.

30. The clock loss sense circuit of claim 1, wherein the first clock signal and the second clock signal have the same frequency.

31. The clock loss sense circuit of claim 1, wherein the first clock signal and the second clock signal have different frequencies.

* * * * *